(12) United States Patent
Parthasarathy et al.

(10) Patent No.: US 9,263,564 B2
(45) Date of Patent: Feb. 16, 2016

(54) POWER INTEGRATED CIRCUIT WITH INCORPORATED SENSE FET

(71) Applicant: Power Integrations, Inc., San Jose, CA (US)

(72) Inventors: Vijay Parthasarathy, Mountain View, CA (US); Sujit Banerjee, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 258 days.

(21) Appl. No.: 13/852,313

(22) Filed: Mar. 28, 2013

(65) Prior Publication Data

US 2013/0207192 A1  Aug. 15, 2013

Related U.S. Application Data

(63) Continuation of application No. 13/532,507, filed on Jun. 25, 2012, now Pat. No. 8,426,915, which is a continuation of application No. 12/455,187, filed on May 29, 2009, now Pat. No. 8,207,580.

(51) Int. Cl.

| | |
|---|---|
| *H01L 23/62* | (2006.01) |
| *H01L 29/772* | (2006.01) |
| *H01L 27/06* | (2006.01) |
| *H01L 27/088* | (2006.01) |
| *H01L 29/78* | (2006.01) |
| *H01L 29/06* | (2006.01) |

(52) U.S. Cl.
CPC .......... *H01L 29/772* (2013.01); *H01L 27/0629* (2013.01); *H01L 27/088* (2013.01); *H01L 29/7835* (2013.01); *H01L 29/0692* (2013.01); *H01L 29/0696* (2013.01)

(58) Field of Classification Search
CPC ..................................................... H01L 29/772
USPC .................................... 257/337, E27.06, 360
See application file for complete search history.

(56) References Cited

U.S. PATENT DOCUMENTS

| | | | | |
|---|---|---|---|---|
| 5,491,357 | A | * 2/1996 | Zambrano | ...................... 257/337 |
| 5,654,560 | A | * 8/1997 | Nishizawa et al. | ........... 257/139 |
| 5,691,555 | A | * 11/1997 | Zambrano et al. | ............ 257/332 |
| 6,404,006 | B2 | * 6/2002 | Li et al. | ........................ 257/321 |

(Continued)

FOREIGN PATENT DOCUMENTS

| | | |
|---|---|---|
| JP | S62114459 | 5/1987 |
| JP | H06045602 | 2/1994 |

(Continued)

*Primary Examiner* — Caleb Henry
(74) *Attorney, Agent, or Firm* — The Law Offices of Bradley J. Bereznak

(57) ABSTRACT

In one embodiment, a power integrated circuit device includes a main lateral high-voltage field-effect transistor (HVFET) and an adjacently-located lateral sense FET, both of which are formed on a high-resistivity substrate. A sense resistor is formed in a well region disposed in an area of the substrate between the HVFET and the sense FET. A parasitic substrate resistor is formed in parallel electrical connection with the sense resistor between the source regions of the HVFET and the sense FET. Both transistor devices share common drain and gate electrodes. When the main lateral HVFET and the sense FET are in an on-state, a voltage potential is produced at the second source metal layer that is proportional to a first current flowing through the lateral HVFET.

20 Claims, 5 Drawing Sheets

(56) References Cited

U.S. PATENT DOCUMENTS

| | | | |
|---|---|---|---|
| 6,888,203 B2* | 5/2005 | Liaw et al. | 257/401 |
| 7,678,656 B2* | 3/2010 | Cai et al. | 438/306 |
| 7,911,031 B2* | 3/2011 | Chiang et al. | 257/537 |
| 8,063,443 B2* | 11/2011 | Cai | 257/335 |
| 2004/0075529 A1* | 4/2004 | Lakshmikumar | 338/308 |
| 2006/0158812 A1* | 7/2006 | Harris et al. | 361/111 |
| 2008/0030297 A1* | 2/2008 | Ohtsuka et al. | 338/22 SD |
| 2008/0061368 A1* | 3/2008 | Williams et al. | 257/336 |
| 2008/0303088 A1* | 12/2008 | Pang | 257/337 |
| 2009/0152668 A1* | 6/2009 | Sone et al. | 257/501 |
| 2009/0224739 A1* | 9/2009 | Zuniga et al. | 323/282 |
| 2009/0230437 A1* | 9/2009 | Kawahito et al. | 257/226 |
| 2010/0320461 A1* | 12/2010 | Su et al. | 257/48 |

FOREIGN PATENT DOCUMENTS

| | | |
|---|---|---|
| JP | H06334189 | 12/1994 |
| JP | H08139200 | 5/1996 |
| JP | H09213926 | 8/1997 |
| JP | H10256541 | 9/1998 |
| JP | 2009081381 | 4/2009 |

* cited by examiner

POWER INTEGRATED CIRCUIT WITH INCORPORATED SENSE FET

This application is a continuation of application Ser. No. 13/532,507, filed Jun. 25, 2012, which is a continuation of application Ser. No. 12/455,187, filed May 29, 2009, entitled, "POWER INTEGRATED CIRCUIT DEVICE WITH INCORPORATED SENSE FET", both of which are assigned to the assignee of the present application.

TECHNICAL FIELD

The present disclosure relates to semiconductor devices, device structures, and processes for fabricating high-voltage integrated circuits or power transistor devices.

BACKGROUND

Current sensing field-effect transistors, which are frequently referred to as sense FETs, have been used for many years in integrated circuit applications where accurate current sensing can provide information for both control and overcurrent protection. Sense FETs are typically constructed as a small part or transistor section of a larger, main current carrying semiconductor device. For example, in a conventional insulated-gate field-effect transistor (MOSFET) device, the sense FET may comprise a small section of the channel region of the main device. In operation, the sense FET may sample a small fraction of the channel current of the larger device, thereby providing an indication of the current flowing through the main transistor device. The sense FET and main device typically share a common drain and gate, but each has a separate source electrode which may or may not be shorted to the body region.

Sense FETs are particularly useful in many power delivery applications to provide current limit protection and accurate power delivery. In order to provide these functions the sense FET needs to maintain a constant current sensing ratio (CSR) with respect to the main high-voltage FET over a wide range of drain currents (100 mA to 10 amperes), temperature (−25° C. to 125° C.), as well as fabrication process variations and mechanical stress/packaging variations. The ratio of drain current of the main high-voltage FET (HVFET) to that of the sense FET typically ranges between 20:1 to 800:1, or greater.

Lateral field-effect transistors are widely used for high-voltage (e.g., greater than 400 volts) integrated circuit applications. In a lateral HVFET structure, a source region is laterally separated from an extended drain or drift region by a channel region. A gate structure is disposed over the channel region, insulated from the underlying semiconductor material by a thin layer of oxide. In the on-state, an appropriate voltage applied to the gate causes a lateral conduction channel to form between the source and extended drain regions, thereby allowing current to flow laterally through the device. In the off-state, the voltage on the gate is sufficiently low such that no conduction channel forms in the substrate and thus no current flows. In the off-state, the device supports a high voltage between the drain and source regions.

Among the difficulties that arise in the design of sense FET for use in a power IC with a lateral HVFET device are drain voltage debiasing and body-effect problems. Debiasing of the drain voltage can occur when the sense resistor (typically coupled between the source and ground) is a large percentage (e.g., >25%) of the sense FET resistance, resulting in a large voltage drop across the sense resistor. This raises the source voltage of the sense FET relative to the gate, thus lowering the gate to source drive of the sense FET relative to the main HVFET. Similarly, in a lateral HVFET where the body is physically connected to the substrate, the body of the sense FET needs to be separate from the source. This causes the sense FET threshold voltage to increase with current and compromises the sense FET tracking to the main HVFET device. Additionally, past attempts to physically locate the sense FET close to the main HVFET (e.g. in a shared well region) to improve tracking have been problematic since doing so can affect the charge balance in the device, resulting in a lower breakdown voltage (BV). Another disadvantage is the location of the sense element which is typically a resistor that is located some distance away from the HVFET region. This results in poor matching to the HVFET.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
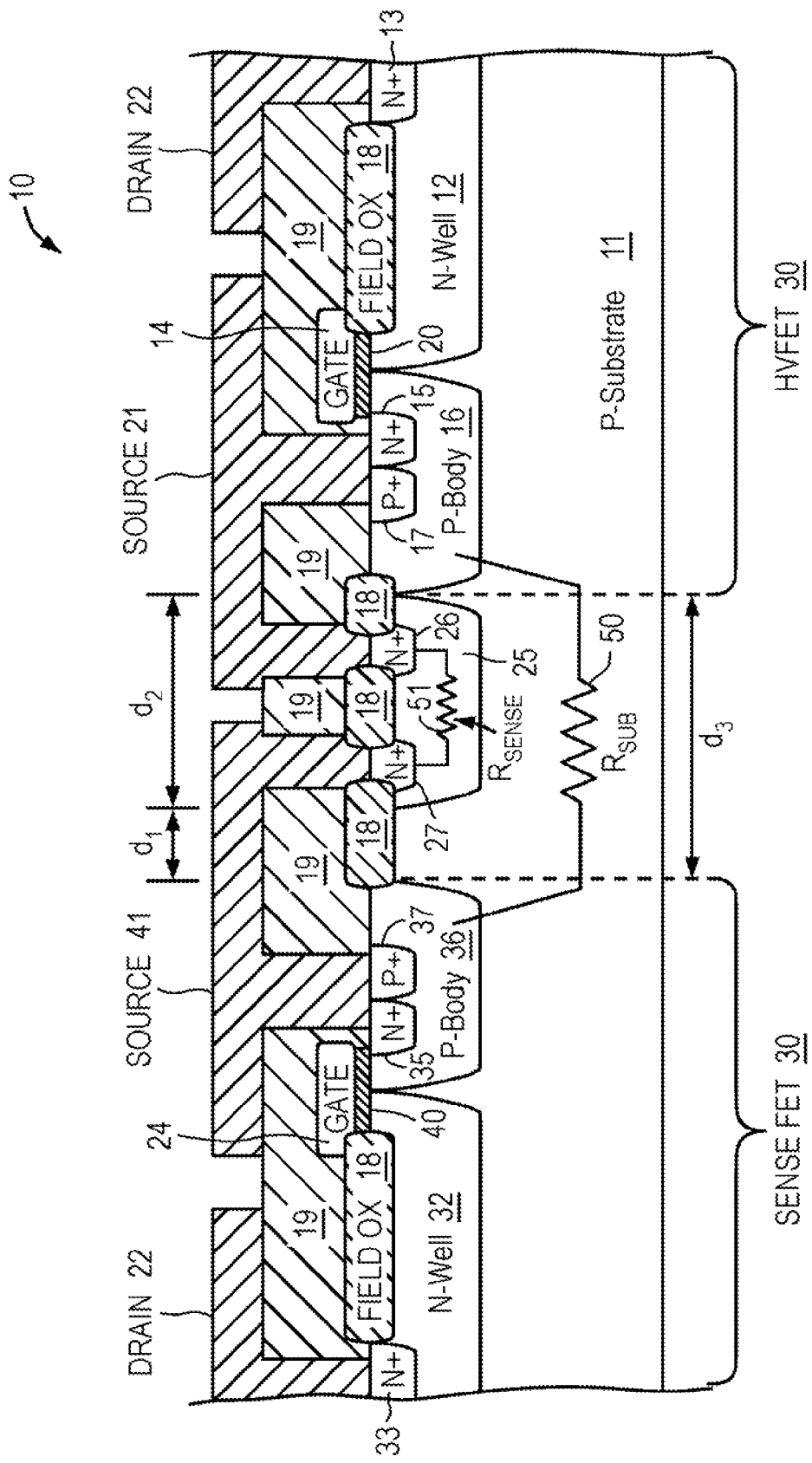
FIG. 1 is a cross-sectional side view of an example sense FET incorporated in a lateral HVFET structure.

FIG. 1 illustrates an example cross-sectional side view of a semiconductor device 10 that includes a main lateral HVFET 30 and an adjacent sense FET 31, both formed on a lightly doped (high resistivity) P-type silicon substrate 11. Substrate 11 is typically lightly doped to increase its resistance to parasitic current flow between P-type body regions 36 and 16, which resistance is shown in FIG. 1 by resistor 50 ($R_{sub}$). In one embodiment, P-substrate 11 is doped to a concentration in a range from about $1 \times 10^{13}$ cm$^{-3}$ to about $1 \times 10^{14}$ cm$^{-3}$, with a resistivity of approximately 100-1000 ohm-cm.

Main HVFET 30 comprises an N+ drain region 13 disposed in a lightly doped (e.g., $2 \times 10^{16}$ cm$^{-3}$) N well region 12 that extends laterally to a more heavily-doped (e.g., $1 \times 10^{7}$ cm$^{-3}$) P body region 16. The portion of N well 12 extending from N+ region 13 to the lateral boundary of N well 12 adjoining P body region 16 comprises the extended drain or drift region of lateral HVFET 30. Most of the extended drain semiconductor material is disposed beneath a relatively thick (~1 μm) field oxide layer 18. P+ region 17 and N+ source region 15 are disposed within P body region 16 at the substrate surface. It is appreciated that the extended drain region of lateral HVFET 30 may comprise a plurality of parallel N-type drift regions situated between p-type body region 16 and N+ drain region 13.

HVFET 30 also includes a gate 14 comprised, for example, of polysilicon, and a gate-insulating layer 20 that insulates gate 14 from the underlying semiconductor regions. Gate-insulating layer 20 may comprise a thin layer of ordinary silicon dioxide or another appropriate dielectric insulating material. As can be seen, gate 14 extends laterally over the substrate from N+ source region 15 to just past the left-most edge of field oxide layer 18 above N well region 12. A thick (~1.5 μm) interlayer dielectric (ILD) 19 insulates gate 14 from source metal layer (electrode) 21. Metal layer 21 electrically contacts P+ region 17 and N+ source region 15 of HVFET 30. Drain metal layer (electrode) 22 electrically contacts N+ region 13 of HVFET 30 as well as N+ drain region 33 of sense FET 31. In other words, the drain regions of sense FET 31 and HVFET 30 are electrically coupled together in device 10.

In one embodiment, the source and drain electrodes comprise aluminum; however, persons of skill in the semiconductor arts will appreciate that in alternative embodiments, the source and drain electrodes may comprise other metals, alloys, or conductive materials (e.g., polysilicon).

Sense FET 31 has a device structure that mirrors that of HVFET 30, although it is appreciated that main HVFET 30 is typically fabricated as a much larger lateral transistor device for greater current handling capability. In the embodiment of FIG. 1, sense FET 31 is shown disposed adjacent to HVFET 30 and comprises an N well region 32 that adjoins a P body region 36. N+ source region 35 and P+ region 37 are both disposed in P body region 36, with the lateral edge of source region 35 being separated from the lateral boundary of P body region 36 that abuts N well 32 by a small distance. A gate 24 extends laterally over this area of P body region 36 from the edge of N+ source region 35 to just past the left-most edge of field oxide layer 18 above N well region 32. Gate 24 is insulated from the underlying semiconductor substrate by a thin gate insulating layer 40, which typically comprises thermally grown oxide. N+ source region 35 and P+ region 37 are both electrically coupled to source metal layer 41. Source metal layer 41 is shown insulated from gate 24 by ILD 19.

Sense FET 31 and HVFET 30 are disposed in high-resistivity P-substrate 11 apart from each other by a distance "$d_3$". The lateral area that separates the two field-effect transistors comprises an N well region 25 and a small area of P-substrate 11 between the left-most edge or boundary of N well region 25 and the right-most edge or boundary of P body region 36 of sense FET 31. A field oxide layer 18 covers the top of the substrate in this small area of the device. The distance $d_3$ is equal to the sum of the lateral width of N well region 25 (distance "$d_2$") plus the width of the small area of P-substrate 11 that separates N well 25 from P body 36 (distance "$d_1$").

In a specific embodiment, the distance $d_3$ that separates P body region 36 of sense FET 31 from P body region 16 of HVFET 30 in FIG. 1 is approximately 75 μm. In other embodiments, this distance may range from 5 μm up to 100 μm or more depending on the geometry of the layout, doping concentration of N well 25, desired value of resistors 50 & 51, etc. Also with proper spacing, the substrate parasitic resistance $R_{sub}$ of resistor 50 can be minimized.

Note that in the embodiment shown, resistor 50 ($R_{sub}$) is formed by the P type semiconductor material of substrate 11, whereas resistor 51 is formed by the N type semiconductor material of N well 25. Thus, in the device structure shown in FIG. 1 resistor 50 ($R_{sub}$) is connected in parallel with resistor 51 ($R_{sense}$). This configuration allows $R_{sense}$ to be approximately 50-100 times lower than $R_{sub}$ to minimize its effect on the tracking accuracy of sense FET 31. In one embodiment, $R_{sense}$=5 ohms, $R_{sub}$=500 ohms, and the device resistance values (drain to source) of HVFET 30 and sense FET 31 are 1 ohm and 25 ohms, respectively. In other embodiments, the ratio of the resistance $R_{sense}$ to the device resistance of sense FET 31 is in the range of about 10:1 to 4:1. The ratio of $R_{sub}$ to $R_{sense}$ may vary between 10:1 and 800:1, or higher. Furthermore, it should be understood that resistor 51 may be implemented as a combination of multiple isolated well regions, one or more of which are connected by N+ contacts (e.g., contacts 27 and 26) to the P body regions 36 and 16.

Practitioners will understand that each of N well regions 12, 25 and 32 may be formed using the same masking/implantation/diffusion steps, so that each of these regions has the same doping concentration and conductivity. Similarly, P body regions 16 & 36 may be formed in the same processing steps. N+ regions 13, 15, 26, 27, 35 and 33 may also be formed in a single sequence of processing steps. Persons of skill in the art will appreciate that a greater uniformity of device characteristics (e.g., sense FET tracking) is achieved by fabricating similar, adjacently-located regions (e.g., N well regions) of the semiconductor device structure using the same processing steps. This also simplifies the overall fabrication process.

Practitioners in the semiconductor arts will further appreciate that current tracking accuracy of sense FET 31 is excellent due to the fact that both sense FET 31 and HVFET 30 are disposed adjacent to each other, yet the sense FET body region 36 and source region 35 are still separated sufficiently from HVFET 30 without compromising the BV of HVFET 30 since the N well regions 32 and 12 are pulled back from P body regions 36 and 16, respectively. Also, because resistor $R_{sense}$ is formed by the same implant/diffusion steps used to fabricate the extended drain (N well) regions of sense FET 31 and HVFET 30, and is physically located in the center of the layout between the two transistors, an extremely high process and package matching is achieved, resulting in a constant current sensing ratio. Furthermore, because $R_{sense}$ resistor 51 is integrated next to sense FET 31 the sense FET signal that may be routed out of the power device region of the IC, and into a controller section of the same IC, is a voltage signal, not a current signal. In other words, source metal 41 may be routed to the controller section of the IC to provide a node voltage utilized as a control signal of the power device.

In the embodiment of FIG. 1 the right-most edge of N well 25 abuts or adjoins the left-most edge of P body region 16 of HVFET 30. Two N+ regions 26 & 27 are respectively disposed in N well 25 near opposite lateral ends of N well 25. N+ region 26 is electrically connected to source metal 21, which is also coupled to source region 15 of lateral HVFET 30. N+ region 27 is electrically connected to source metal 41, which is also coupled to source region 35 of sense FET 31. Source regions 21 and 41 are therefore electrically connected through a resistor 51 ($R_{sense}$) formed by the semiconductor material in N well 25. The resistance of resistor 51, of course, depends upon the doping level of N well 25 and the separation distance between N+ contact regions 26 & 27.

In another embodiment, one or more vertically-stacked, vertically-separated P-type buried layers may be disposed in each of N well regions 12, 25 and 32 to form a plurality of lateral JFET conduction channels therein. For example, a plurality of P-type buried layers may be formed in each of the N well regions by implantation of an appropriate dopant such that each P buried layer is fully disposed within (i.e., surrounded on all sides) by the corresponding N well region. In this manner, each P buried layer is separated from every other P buried layer. The uppermost P buried region may be disposed either below or coincident with the upper surface of the N well region. In a particular implementation, the doping concentration in each P buried layer may be within a range of about 1×10$^{12}$/cm$^3$ to about 2×10$^{12}$/cm$^3$. Because the resistance of the JFET channels formed by inclusion of the P buried layers in each N well is inversely proportional to the total charge in these channels, each additional P-buried layer results in a reduction in on-resistance of the HVFET and sense FET devices.

Figure 2:
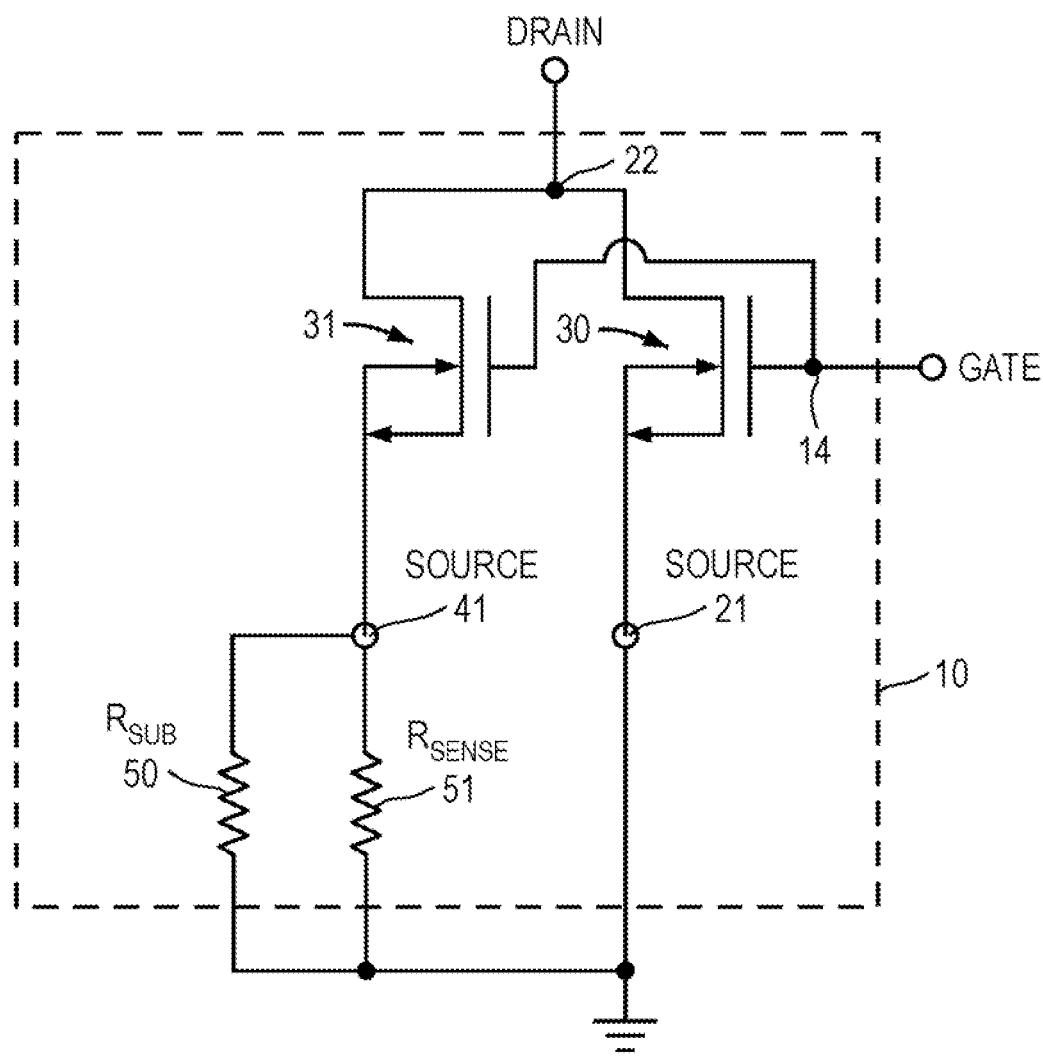
FIG. 2 is an example circuit schematic diagram of the integrated device shown in FIG. 1.

The circuit schematic diagram of FIG. 2 illustrates that lateral HVFET 30 and sense FET 31 share a common gate node 14 and a common drain node 22. Note that resistors 50 & 51 are connected in parallel between source metal layer (node) 41 of sense FET 31 and ground, whereas source metal layer (node) 21 of HVFET 30 is connected directly to ground potential. As explained above, source node 41 of sense FET 31 may be used to sample a voltage proportional to a small portion of the current flowing through the much larger lateral transistor device 30, thereby providing an indication of the current flowing through HVFET 30.

Figure 3:
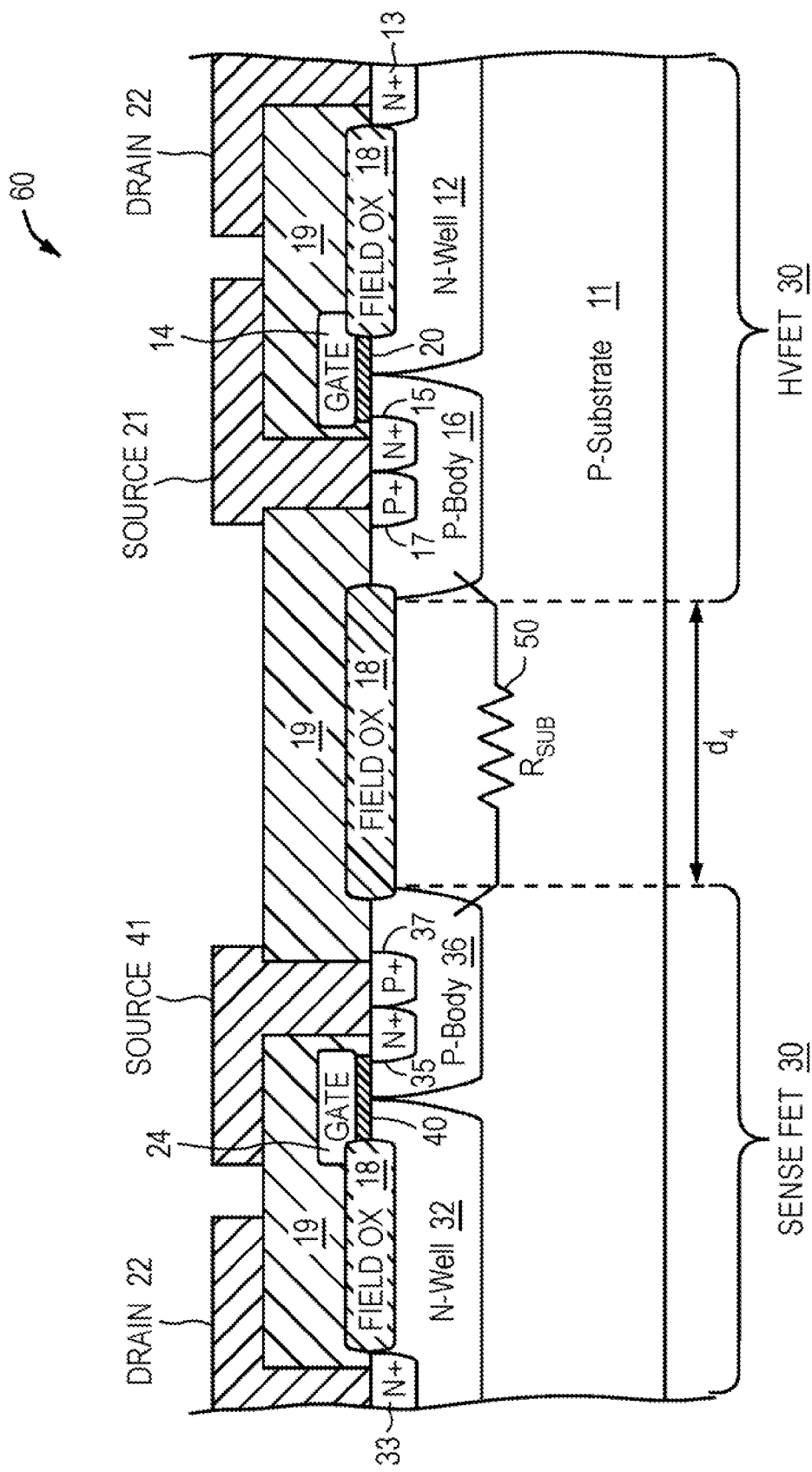
FIG. 3 is a cross-sectional side view of another example sense FET incorporated in a lateral HVFET structure.

FIG. 3 is a cross-sectional side view of another example sense FET incorporated in a lateral HVFET structure. Device 60 of FIG. 2 is arranged and fabricated in the same manner as the device of FIG. 1, except that sense resistor R$_{sense}$ is no longer incorporated into the center location of the layout between HVFET 30 and sense FET 31. In this embodiment, sense resistor R$_{sense}$ is disposed in another area of the substrate (either nearby or remote to device 60). In FIG. 3, P body regions 16 and 36 are shown being separated by a distance d$_4$, which distance may range between 5-100 µm, depending on the layout of the device. A field oxide layer 18 extends over the lateral surface of substrate 11 between P body regions 16 and 36.

Figure 4:
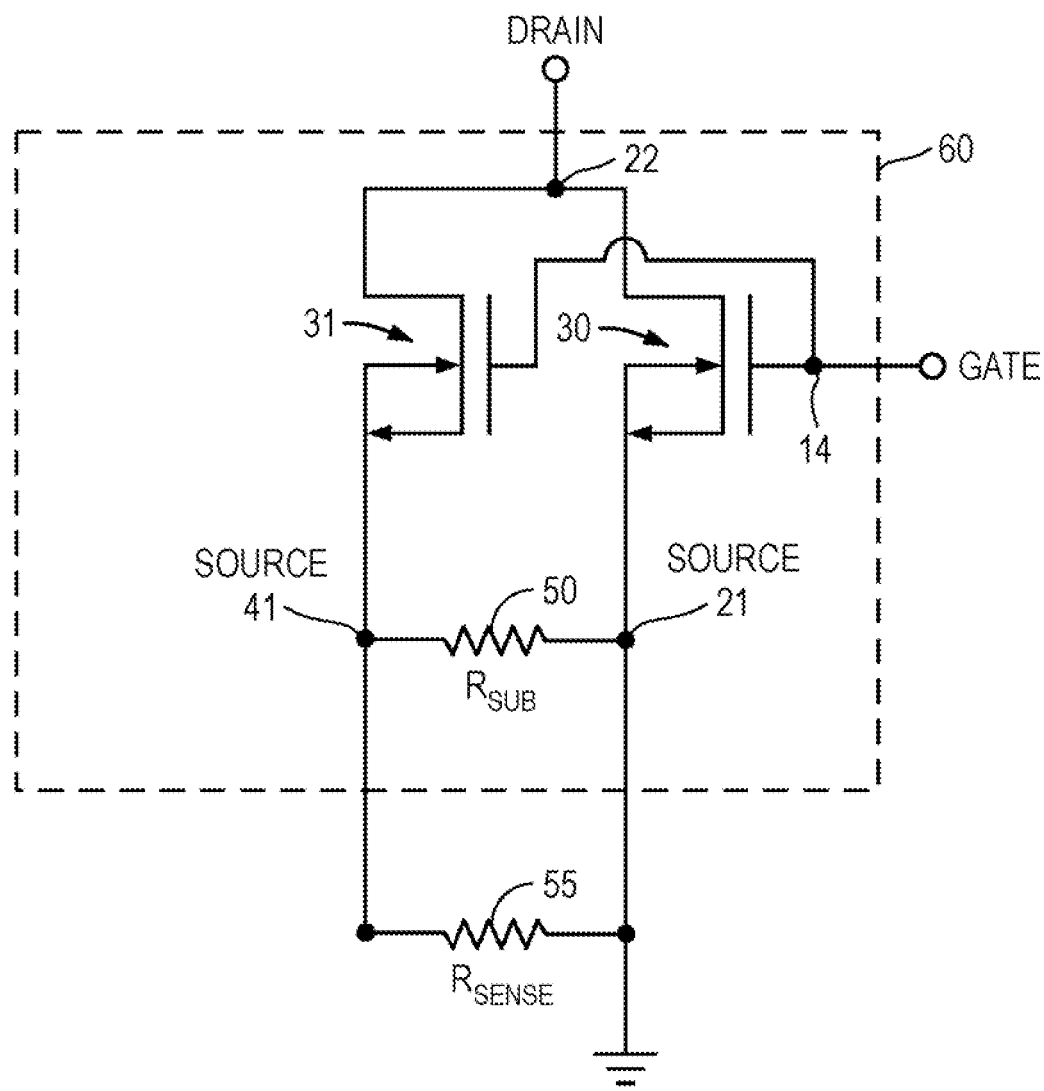
FIG. 4 is an example circuit schematic diagram of the integrated device shown in FIG. 3.

FIG. 4 is an example circuit schematic diagram of the integrated device shown in FIG. 3. Note that respective source nodes 21 and 41 of HVFET 30 and sense FET 31 are electrically coupled through the high-resistivity P-substrate resistor 50 within device 60. In addition, sense resistor 55 (shown external to device 60) is shown connected in parallel between nodes 21 & 41. Source node 21 is shown connected to ground. In the embodiment of FIGS. 3 & 4, source node 21 may be coupled to the controller section of the power IC to provide a voltage signal representative of the current flowing through lateral HVFET 30.

Figure 5:
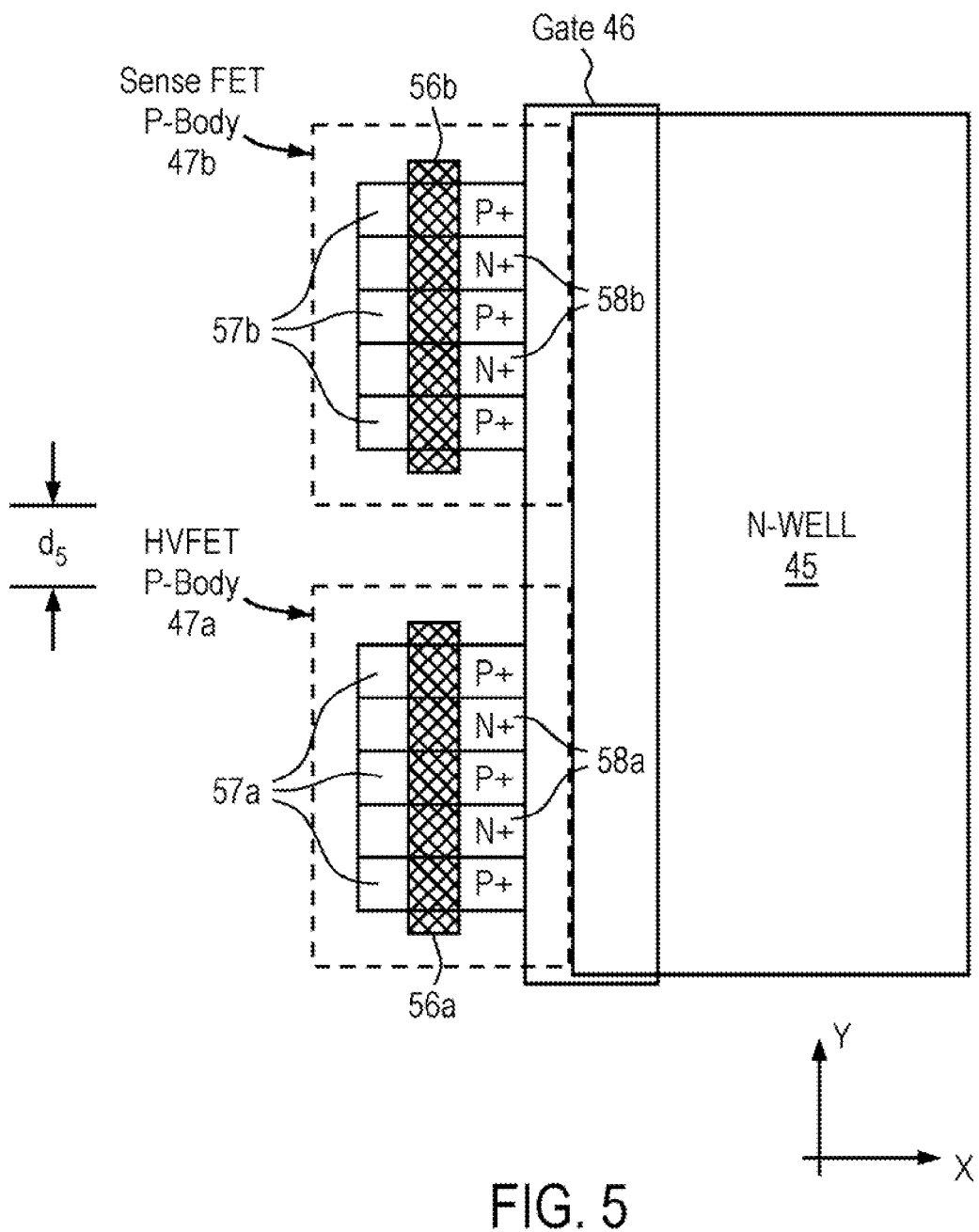
FIG. 5 is a top view of an example layout of a sense FET incorporated in a lateral HVFET structure.

FIG. 5 is a top view of an example layout of a sense FET incorporated in a lateral HVFET structure. Note that in this embodiment, a single N well region 45 is utilized to form the extended drain region of both the sense FET and HVFET transistor devices. The left-most lateral edge or boundary of N well region 45 adjoins two separate P body regions 47a & 47b, associated with the main lateral HVFET device and the sense FET, respectively. A group of alternating P+ and N+ regions 57 & 58, respectively, are shown disposed within each of the P body regions 47. For example, N+ source regions 58a are shown interposed between each of P+ regions 57a in main P body region 47a. Likewise, N+ source regions 58b are shown interposed between each of P+ regions 57b in main P body region 47b. A single elongated gate member 46 is shown extending in the x-direction laterally from the right-hand edge of each of regions 57 & 58 (over P body regions 47) to a short distance over N well 45. Gate 46 extends in the y-direction laterally from the top edge of sense FET P body region 47b to the bottom edge of main P body region 47a.

In FIG. 5, P body regions 47a & 47b are shown separated by a distance d$_5$, which in one embodiment is approximately 5 µm. In this embodiment, only the high-resistivity P-type substrate 11 separates P body regions 47a & 47b. That is, the sense resistor in not incorporated in the device layout shown in FIG. 5.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Furthermore, although n-channel devices have been described, it is appreciated that p-channel device structures may also be implemented by appropriate changes in the conductivity types of the various semiconductor regions. In addition, the embodiments shown by way of example are applicable to both single RESURF and multiple RESURF lateral structures. Accordingly, the specification and drawings are to be regarded in an illustrative rather than a restrictive sense.

We claim:

1. A power integrated circuit (IC) device comprising:
a substrate of a first conductivity type;
a lateral high-voltage field-effect transistor (HVFET) which includes a first drain region disposed in a first well region of a second conductivity type opposite to the first conductivity type, a first source region disposed in a first body region of the first conductivity type, a first insulated gate that laterally extends from over the first well region to over the first body region adjacent the first drain region, and a first source electrode electrically connected to the first source region;
a sense FET laterally spaced-apart from the lateral HVFET by a first distance, the sense FET including a second drain region disposed in a second well region of the second conductivity type, a second source region disposed in a second body region of the first conductivity type, a second insulated gate that laterally extends from over the second well region to over the second body region adjacent the second drain region, and a second source electrode electrically connected to the second source region;
a third well region of the second conductivity type disposed in an area of the substrate between the first and second body regions, the third well region being laterally separated from the second body region by a second distance, a sense resistor being formed between first and second contact regions laterally spaced-apart by a third distance in the third well region, the first source electrode being electrically connected to the first contact region and the second source electrode being electrically connected to the second contact region, wherein when the lateral HVFET and the sense FET are in an on-state, a voltage potential is produced at the second source electrode that is proportional to a first current flowing through the lateral HVFET.

2. The power IC device of claim 1 further comprising a parasitic substrate resistor disposed in the substrate between the first and second body regions, the parasitic substrate resistor being electrically coupled in parallel with the sense resistor between the first source region and the second source region.

3. The power IC device of claim 2 wherein the parasitic substrate resistor has a value at least 25 times greater than a resistance of the sense resistor.

4. The power IC device of claim 2 further comprising third and fourth contact regions of the first conductivity type disposed in the first and second body regions, respectively, the first source electrode electrically contacting the third contact region and the second source electrode electrically contacting the third contact region such that the parasitic substrate resistor is connected in parallel with the sense resistor between the first and second source electrodes.

5. The power IC device of claim 1 wherein the resistance of the sense resistor is least 4 times smaller than a device resistance of the sense FET.

6. The power IC device of claim 1 wherein the device resistance of the sense FET is at least 10 times greater than a device resistance of the lateral HVFET.

7. The power IC device of claim 1 wherein the first distance is substantially equal to a sum of the second distance and the third distance.

8. The power IC device of claim 1 wherein the second distance is greater than the first distance.

9. An integrated circuit comprising:
   a controller region;
   a high-voltage field-effect transistor and a sense field-effect transistor formed on a single substrate and sharing a common gate node and a common drain node, the high-voltage field-effect transistor and the sense field-effect transistor each comprising:
      a source region of a first conductivity type disposed in a body region of the second conductivity type,
      a drain region of the first conductivity type and coupled to an extended drain region of the first conductivity type, and
      an insulated gate formed over a channel region between the source region and the extended drain region,
   wherein the drain regions are coupled to the common drain node and the insulated gates are coupled to the common gate node;
   a sense resistor coupled between a source node of the high-voltage field-effect transistor and a source node of the sense field-effect transistor, wherein the sense resistor comprises spaced-apart contact regions; and
   a metal layer that contacts the source region of the sense field-effect transistor and a first of the contact regions to form the source node of the sense field-effect transistor, wherein the metal layer is routed to the controller region to provide a voltage for use as a control signal.

10. The integrated circuit of claim 9, wherein the extended drain of the high-voltage field-effect transistor and the extended drain of the sense field-effect transistor are both formed in well regions of the first conductivity type, the well regions having matched physical properties characteristic of having been formed in a same processing step.

11. The integrated circuit of claim 9, wherein the sense resistor is formed in a well region of the first conductivity type, the well region of the sense resistor having matched physical properties characteristic of having been formed in the same processing step as the well regions of the extended drains of the high-voltage field-effect transistor and the sense field-effect transistor.

12. The integrated circuit of claim 9, wherein the a) well region of the high-voltage field-effect transistor, b) the well region of the sense field-effect transistor, and c) the well region of the sense resistor each comprise one or more buried layers of the second conductivity type, the one or more buried layers forming a plurality of lateral JFET conduction channels the respective of the extended drains.

13. The integrated circuit of claim 9, wherein the one or more buried layers comprises an uppermost buried layer is disposed coincident with an upper surface of the respective well region.

14. The integrated circuit of claim 9, wherein a ratio of a resistance of the sense resistor and a resistance between body regions of the high-voltage field-effect transistor and the sense field-effect transistor is between 10:1 and 800:1.

15. An integrated circuit comprising:
   a high-voltage field-effect transistor and a sense field-effect transistor formed on a single substrate and sharing a common gate node and a common drain node, the high-voltage field-effect transistor and the sense field-effect transistor each comprising:
      a source region of a first conductivity type disposed in a body region of the second conductivity type,
      a drain region of the first conductivity type disposed in a well region of the first conductivity type, the well region forming an extended drain, and an insulated gate formed over a channel region between the source region and the extended drain region,
   wherein the drain regions are coupled to the common drain node and the insulated gates are coupled to the common gate node;
   a sense resistor coupled between a source node of the high-voltage field-effect transistor and a source node of the sense field-effect transistor, wherein the sense resistor comprises spaced-apart contacts in a well region of the first conductivity type, wherein the body region of the sense field-effect transistor is disposed laterally between the well region of the sense field-effect transistor and the well region of the sense resistor, the body region of the sense field-effect transistor being separated from the well region of the sense resistor by a high-resistivity region of semiconductor material.

16. The integrated circuit of claim 15, wherein the high-resistivity region of semiconductor material comprises a region of the substrate.

17. The integrated circuit of claim 15, wherein the well region of the high-voltage field-effect transistor, the well region of the sense field-effect transistor, and the well region of the sense resistor each comprise a buried layer of the second conductivity type and disposed coincident with an upper surface of the respective well region.

18. The integrated circuit of claim 15, further comprising a metal layer that contacts the source region of the sense field-effect transistor and a first of the contact regions to form the source node of the sense field-effect transistor, wherein the metal layer is routed to a controller region of the integrated circuit to provide a voltage for use as a control signal.

19. The integrated circuit of claim 15, wherein a ratio of a resistance of the sense resistor and a resistance between body regions of the high-voltage field-effect transistor and the sense field-effect transistor is between 10:1 and 800:1.

20. The integrated circuit of claim 15, wherein the well region of the high-voltage field-effect transistor, the well region of the sense field-effect transistor, and the well region of the sense resistor have matched physical properties characteristic of having been formed in a same processing step.

* * * * *